TRANSISTOR AMPLIFIERS AND CIRCUIT ARRANGEMENTS THEREFOR

Filed May 26, 1951 4 Sheets-Sheet 1

INVENTOR
R.L. WALLACE JR.
BY Harry C. Hart
ATTORNEY

TRANSISTOR AMPLIFIERS AND CIRCUIT ARRANGEMENTS THEREFOR

Filed May 26, 1951 4 Sheets-Sheet 2

INVENTOR
R. L. WALLACE JR.
BY Harry C. Hart
ATTORNEY

TRANSISTOR AMPLIFIERS AND CIRCUIT ARRANGEMENTS THEREFOR

Filed May 26, 1951 4 Sheets-Sheet 3

INVENTOR
R. L. WALLACE JR.
BY Harry C. Hart
ATTORNEY

March 20, 1956 R. L. WALLACE, JR 2,739,190

TRANSISTOR AMPLIFIERS AND CIRCUIT ARRANGEMENTS THEREFOR

Filed May 26, 1951 4 Sheets-Sheet 4

INVENTOR
R. L. WALLACE JR.
BY Harry C. Hart
ATTORNEY

United States Patent Office 2,739,190

Patented Mar. 20, 1956

2,739,190

TRANSISTOR AMPLIFIERS AND CIRCUIT ARRANGEMENTS THEREFOR

Robert L. Wallace, Jr., Plainfield, N. J., assignor to Bell Telephone Laboratories, Incorporated, New York, N. Y., a corporation of New York Application May 26, 1951, Serial No. 228,505

7 Claims. (Cl. 179—171)

This invention relates to semiconductor translating devices and particularly to an amplifier employing a transistor in which the current multiplication factor is slightly less than unity.

In an application of W. Shockley, Serial No. 35,423, filed June 26, 1948, issued September 25, 1951, as Patent 2,569,347, there is described a semiconductor translating device of which the outstanding structural feature is that it is composed of three contiguous regions of alternately opposite conductivity types. In contradistinction to the so-called type-A transistor of Bardeen-Brattain Patent 2,524,035, in which the emitter and collector electrodes are point contacts which engage the surface of a semiconductor body, at least one of the emitter and collector connections of the device of the Shockley patent, and preferably both, are constituted by junctions between materials of different conductivity type and inside the body. The device is also described by W. Shockley in an article entitled "The Theory of p-n Junctions in Semiconductors and p-n Junction Transistors," published in the Bell System Technical Journal for July 1949, vol. 28, page 435. Techniques for fabricating such a unit are described in an application of G. K. Teal, Serial No. 168,184, filed June 15, 1950 issued December 20, 1955, as Patent No. 2,727,840.

These units have a number of properties of interest for circuit applications of many varieties. Among these are a relatively low noise figure, freedom from short-circuit instability, high power gain, low internal power dissipation, freedom from microphonics, high efficiency and excellent power handling capacity, ability to operate with an exceedingly small internal consumption of power and with very small operating bias sources, ruggedness, and small size. For the purposes of the present invention, two especially important features of these transistors are that their current multiplication factors are very slightly less than unity and their collector resistances are high. Among their few objectionable features or defects is the fact that the emitter current-voltage characteristic is highly non-linear. Since, like the type-A transistor of Bardeen-Brattain Patent 2,524,035, it is a current-operated device, as distinguished from a voltage-operated device, it follows that in order to realize high efficiency with low distortion in the translation of large input signals, these input signals must be applied in the form of controlled currents rather than controlled voltages, e. g., they may be derived from a high impedance signal source.

It will appear from the detailed discussion which follows that by appropriate selection of its operating point, and by virtue of the fact that its current multiplication factor is slightly less than unity, the input impedance of the new transistor may be exceedingly high, namely, of the order of 10 megohms or so, especially when the external circuit is of the so-called "grounded-collector" configuration in which the collector electrode is the one which is common to the input and output circuits, the load being connected to the emitter and the input signal being applied to the base. In the circuit of the conventional grounded-collector configuration, the base electrode is returned to the collector electrode or ground by way of a resistor, and this resistor evidently shunts the input impedance of the device. With the exceedingly high input impedance which is obtainable with the new unit, the external base return resistor, if it is not seriously to short-circuit the input impedance, must be of the order of several tens of megohms. Such a resistor which shall at the same time have desirable stability with age and temperature, ruggedness, and the like is difficult to obtain in commerce or to construct by known techniques.

The present invention in one of its major aspects is based upon the discovery that this base return resistor may be omitted, making the effective shunting resistance practically infinite. Such omission naturally restricts operation to certain specific conditions, but it turns out that these conditions are entirely satisfactory as a practical matter. Thus, the problem of finding a resistor which shall not detrimentally shunt the input impedance has been solved while at the same time the cost of the resistor has been economized, and the space which it would otherwise occupy has been saved.

The invention will be explained in detail in connection with a preferred embodiment in which the transistor is of the n-p-n variety, and the amplifier is of the grounded-collector configuration. This selection is merely illustrative, and it will be apparent from what follows that the invention is to a large extent applicable to other configurations and to translating devices other than amplifiers, such, for example, as modulators and the like, and that it may be practiced with a transistor of any structural variety provided only that its current multiplication factor is slightly less than unity and that its collector resistance is high.

The invention will be fully apprehended by reference to the following detailed description of a preferred embodiment thereof, in which.

Figure 1:
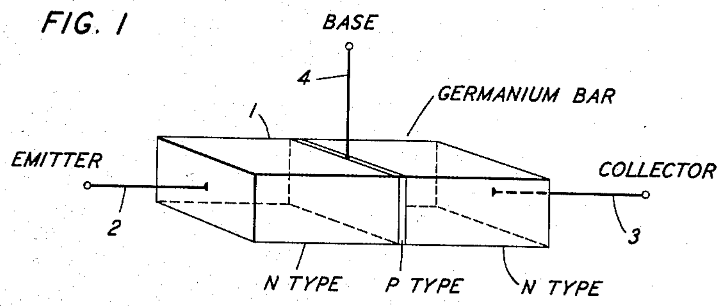
Fig. 1 is a schematic perspective diagram showing an n-p-n transistor.

Fig. 1 is a perspective diagram showing the structure of a two-junction transistor of the type described by W. Shockley in his patent application and publication referred to above. It comprises a block 1 of a semiconductive material such as germanium having a zone of one conductivity type between and contiguous with a pair of zones of the opposite conductivity type. The block may be fabricated in the fashion described in the aforementioned application of G. K. Teal, and connections may be made to the outer zones by plating or soldering, and to the intermediate zone by the techniques described in an application of W. Shockley, Serial No. 228,483, filed May 26, 1951, now Patent 2,654,059, issued September 29, 1953. In the particular case illustrated, the intermediate zone is of p-type conductivity while the outer zones are of n-type conductivity.

An emitter connection 2 is made to the left-hand n-type zone, a collector connection 3 is made to the right-hand n-type zone, and a base connection 4 is made to the intermediate p-type zone. These connections are made in any desired fashion providing mechanical strength and solid, rugged, electrical contact.

In the case of the type-A transistor of Bardeen-Brattain Patent 2,524,035, the transistor conductivity type is named from the conductivity type of the major part of the body of the block to which the base electrode is connected. Thus, when the body of the block is of n-type conductivity, the transistor is known as an n-type transistor despite the fact that its operation may depend on the presence of a layer of p-type material on its surface with which the emitter and collector electrodes are in engagement. Similarly, with a block of which the body is of p-type conductivity, as described by W. G. Pfann in the Proceedings of the Institute of Radio Engineers, for October 1950, vol. 38, page 1151, a type-A transistor is known as a p-type transistor despite the fact that its emitter and collector electrodes may engage an n-type surface layer.

By analogy with type-A transistors, the double-junction transistors described in the aforementioned application for patent and publication of W. Shockley are designated as p-type or n-type in relation to the conductivity type of the intermediate zone to which the base electrode 4 is connected despite the fact that it no longer occupies the major part of the body of the block.

The double-junction transistor of Fig. 1 is especially well adapted to the practice of the present invention; but, as will be seen from what follows, the present invention is not necessarily restricted to a transistor of this structure, any transistor, for example a type-A transistor being suitable provided it has the required operating characteristics. Therefore, in the other figures, the transistor employed is shown in the drawings by the symbol which has now become conventional for transistors generally, whether of the type-A variety or of the double-junction variety. The symbol is specific only in the sense that the arrowhead which identifies the emitter electrode 2 points outward from the body of the block, and this designates that the transistor is a p-type transistor. It will be seen from what follows that the invention can equally well be practiced with an n-type transistor, symbolized by an inwardly pointing arrow on the emitter electrode, provided all currents and voltages are changed in sign.

Figure 2:
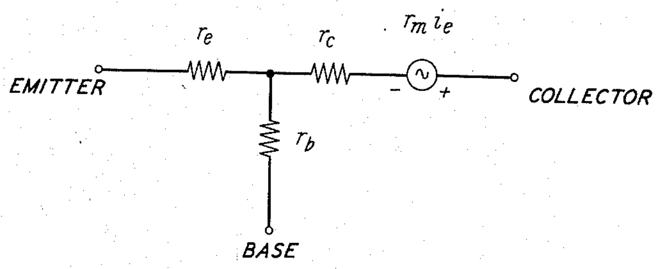
Fig. 2 is an equivalent circuit diagram of a p-type transistor of assistance in describing its operation.

Ryder and Kircher have shown in an article entitled "Some Circuit Aspects of the Transistor," published in the Bell System Technical Journal for July 1949, vol. 28, page 367, that it is convenient to analyze the small signal behavior of a transistor of any sort in terms of the equivalent circuit of Fig. 2, where $r_e$ is called the emitter resistance, $r_b$ is called the base resistance, and $r_c$ is called the collector resistance. The internal generator $r_m i_e$ is the active part of the equivalent circuit and in the respect is the counterpart of the familiar $\mu e_g$ of vacuum circuit theory. Ryder and Kircher have shown in particular that if the transistor is connected in the grounded-collector configuration of Fig. 3, the input impedance of the amplifier depends on the magnitudes of the above-mentioned parameters in the equivalent circuit and on the magnitude of load resistance which is connected to the output terminals of the amplifier in accordance with the following equation $$R_i = r_b + r_c - \frac{r_c(r_c - r_m)}{r_e + r_c - r_m + R_L} \quad (1)$$

where $R_L$ is the resistance of the load.

In order to interpret the meaning of this equation for n-p-n transistors, it is necessary to specify the magnitudes of the various resistances which characterize it. Typical values for these quantities are $r_e$=25 ohms
$r_b$=100 ohms
$r_c$=10 megohms
$r_c-r_m$=50,000 ohms In view of these values, Equation 1 can be written, to a good approximation, in the form $$R_i = r_c\left[1 - \frac{1}{1 + \frac{R_L}{r_c - r_m}}\right] \quad (2)$$

wherefrom it is seen that the input resistance is closely equal to the collector resistance, provided $R_L$ is large compared to $r_c-r_m$; that is to say, in the numerical example quoted above, provided $R_L$ is large compared to 50,000 ohms. If this condition is met, the input resistance of the circuit is of the order of 10 megohms.

An amplifier circuit characterized by such a high input impedance is of use in many applications, particularly when the internal impedance of the generator from which the amplifier is driven is high. For example, such an amplifier is useful as an input stage to be driven by a condenser microphone or a crystal microphone, both of which devices have very high internal impedance.

Figure 3:
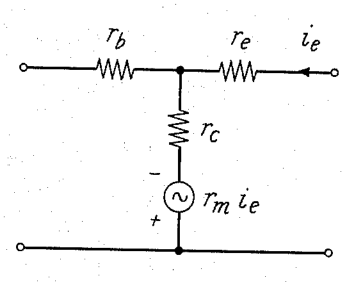
Fig. 3 is an equivalent circuit diagram of the same transistor with its electrodes externally connected in the grounded-collector configuration.
Figure 7:
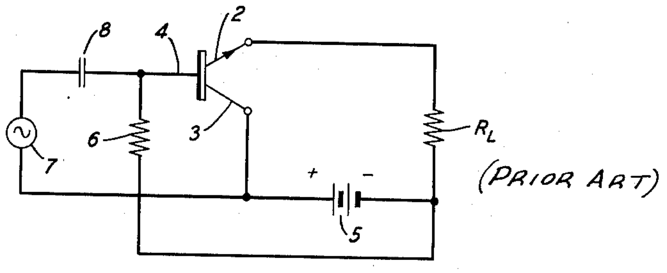
Fig. 7 is a schematic circuit diagram of a transistor amplifier of the grounded-collector configuration.
Figure 8:
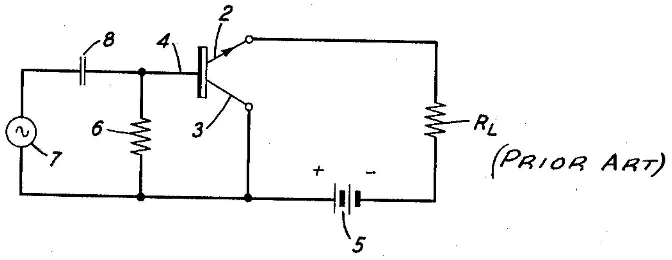
Fig. 8 is a schematic circuit diagram of a variant of Fig. 7.

In the circuit of Fig. 3, no indication has been given of means for supplying the necessary steady operating biases to the transistor. Figs. 7 and 8 indicate possible connections for supplying these biases in accordance with well-known circuit techniques. (The polarities indicated in these figures are appropriate for p-type transistors, in which class the n-p-n transistor belongs, as distinguished from transistors of the "n-type" class, of which the p-n-p variety is a member.) On this account, the polarities of the batteries 5 indicated in Figs. 7 and 8 are opposite to those indicated by Ryder and Kircher for n-type transistors. These figures show conventional connections for the application of the signals of a source 7 to the amplifier by way of a blocking condenser 8.

In the circuits of Figs. 7 and 8, the magnitude of the biasing resistor 6 determines the collector and emitter currents which flow in the transistor. If large emitter and collector operating currents are desired, the circuit of Fig. 8 is appropriate, while for working with very small values of emitter and collector operating currents, the connection of Fig. 7 is suitable.

It will be noted, however, that in each of these circuits, the resistor 6 is effectively shunted across the input terminals of the amplifier and hence produces the undesirable effect of reducing the effective impedance of the circuit as a whole. This becomes particularly important when it is desired to achieve circuit input resistances of the order of ten megohms, in which case the effect of the resistor 6 is detrimental unless its magnitude is of the order of at least several tens of megohms. This normally leads to circuit complications.

Figure 9:
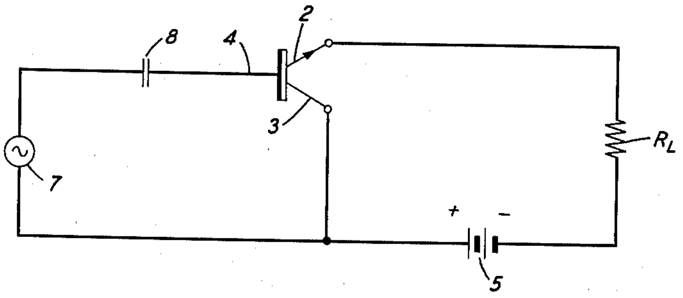
Fig. 9 is a circuit diagram of a grounded-collector transistor amplifier modified in accordance with the invention.

In accordance with the invention, these complications are completely avoided by employing the circuit of Fig. 9. Here, since no direct current can flow into or out of the base connection 4 of the transistor, it follows that the emitter current must be exactly equal in magnitude but opposite in sign to the collector current. It is shown below that this restriction leads to values of emitter and collector currents which are entirely suitable for n-p-n transistors and hence that it is entirely practical to make use of the circuit of Fig. 9 in achieving transistor amplifiers of exceedingly high input resistance.

Figure 4:
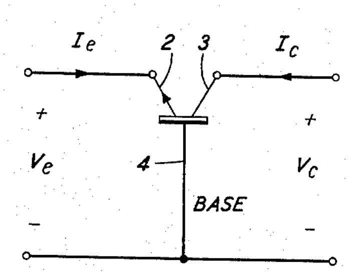
Fig. 4 is a symbolic diagram of a p-type transistor of assistance in specifying the polarities of currents and voltages.

In order to discuss the currents which flow in the circuit of Fig. 9, it is convenient to refer to the static characteristics of an n-p-n transistor shown in Figs. 5A, 5B, 6A, and 6B. The convention of signs by which the positive direction of these currents and voltages is assigned is indicated in Fig. 4 which shows that the emitter and collector voltages are called positive when the emitter and the collector are at positive potentials with respect to the base and that the emitter and collector currents are called posititve when they flow into the emitter and collector connections, respectively, as indicated in Fig. 4.

Ryder and Kircher have shown that the values of $r_c$, $r_e$, $r_b$, and $r_m$ for any transistor can be determined directly from the slopes of static characteristic curves, such as those shown in Figs. 5A, 5B, 6A, and 6B. Also, Ryder and Kircher have made use of a quantity $\alpha$ which is known as the current amplification factor of the transistor and is defined by the equation $$\alpha=\frac{\partial I_c}{\partial I_e},\ V_C=\text{Constant} \qquad (3)$$

which states in effect that if the collector voltage is held constant while the emitter current is increased by an increment $\Delta I_e$, the resulting increment of collector current is $\alpha\Delta I_e$.

Figure 5A:
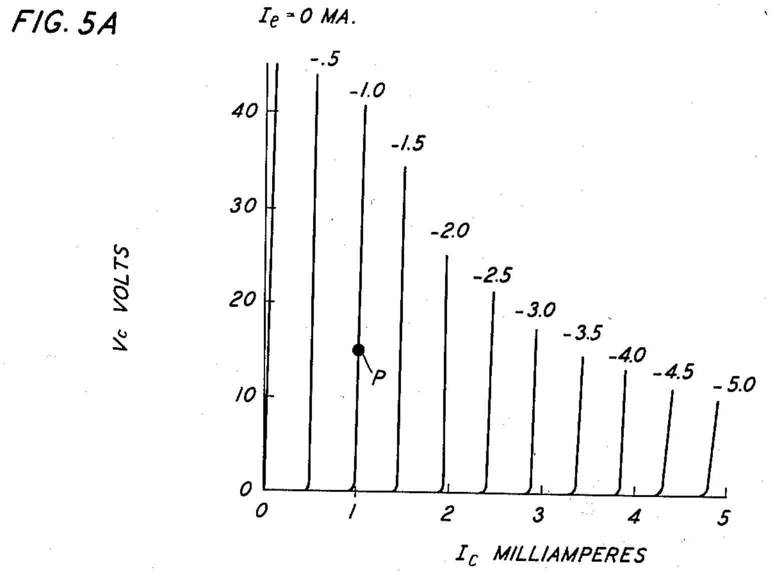
Figs. 5A and 5B are current-voltage characteristics of the transistor of Fig. 1.
Figure 6A:
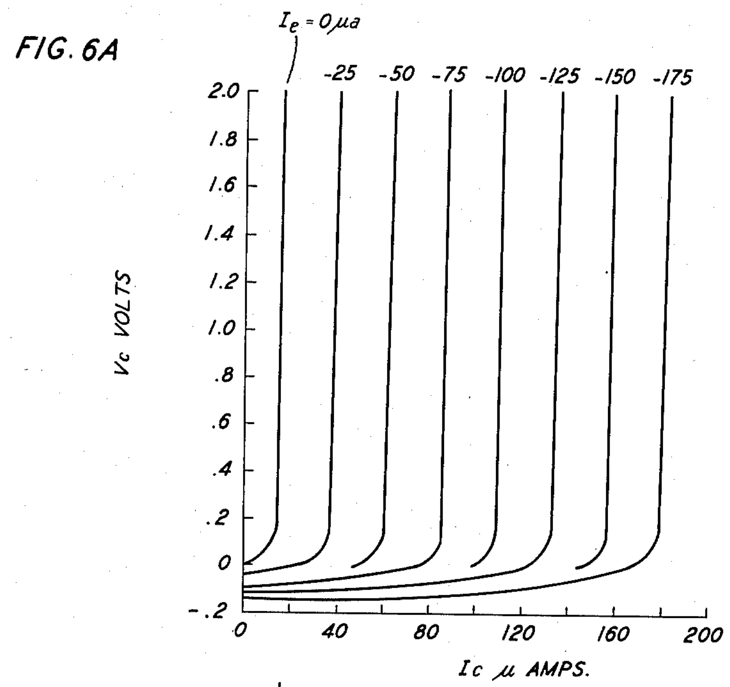
Figs. 6A and 6B show, to an enlarged scale, the portions of the characteristics of Figs. 5A and 5B lying closest to the origin of coordinates.

From this discussion of the meaning of $\alpha$, it follows that the value of $\alpha$ is proportional to the horizontal spacing between the characteristics shown in Figs. 5A and 6A. The fact that the various characteristics in these figures are quite uniformly spaced, one with respect to the other, indicates that the current amplification factor of the transistor is essentially constant and does not depend on the voltage or current with which the collector is biased.

With these considerations in mind, it will now be shown in terms of these static characteristics what values of emitter and collector currents flow when a voltage is applied between the emitter and the collector while no direct-current connection is made to the base of the transistor, as in Fig. 9.

Figure 5B:
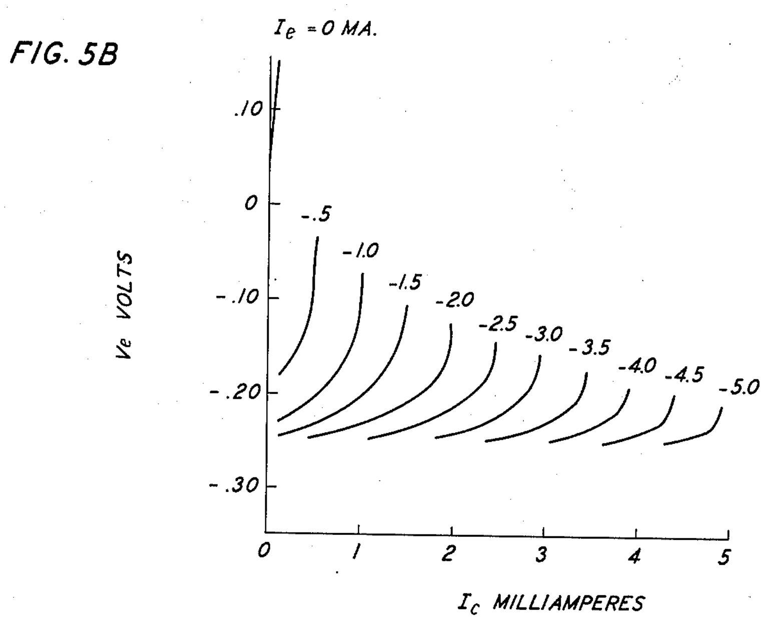
Figure 6B:
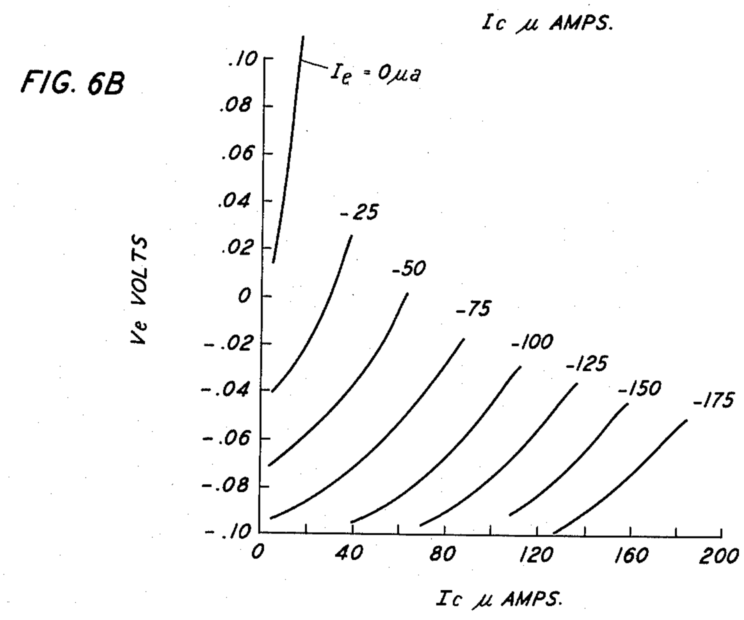

By referring to Figs. 5B and 6B, it can be seen that the voltage which appears between the emitter and the base is always very small, of the order of a few tenths of a volt at most, and that, therefore, almost all of the voltage applied between emitter and collector in Fig. 9 actually appears as a voltage drop between the base and the collector. To a good approximation then, it can be assumed that the collector voltage is equal to the voltage of the battery, less the voltage drop across the load resistance, in the circuit of Fig. 9. Refer now to the plot of Fig. 6A, from which it can be seen that a small collector current, of the order of 17 or 18 microamperes, flows even when the emitter current is reduced to zero. The operating point of the circuit of Fig. 9 is therefore certainly not along this line ($I_e$=zero) because in this case, the collector current is not equal to the emitter current, but is 17 or 18 microamperes greater. Consider, however, how this situation changes as one progresses from left to right across the set of static characteristics of Fig. 6A. For each increment $\Delta I_e$ in emitter current, the collector current increases by an amount $\alpha\Delta I_e$. As above explained, the current amplification factor $\alpha$ of the transistor in question is slightly less than unity. Hence, as the emitter current increases, the collector current becomes more nearly equal to the emitter current. The two currents are just equal when the following equation is satisfied.

$$I_e=Ic_0+\alpha I_e \qquad (4)$$

That is when $$I_e=\frac{Ic_0}{1-\alpha} \qquad (5)$$

In these equations, $Ic_0$ designates the collector current which flows when the emitter current is precisely zero; and this, from Fig. 6A, is approximately 17 microamperes. Since $\alpha$ is nearly equal to unit, Equation 5 states that the emitter and collector current which flows in the circuit of Fig. 9 is many times greater than $Ic_0$. For the particular transistor corresponding to the static characteristics shown, this current amounts to approximately one milliampere when the battery voltage is 15 volts. This can be seen by observing in Fig. 5A that the characteristic corresponding to $I_e=-1$ milliampere crosses the vertical line corresponding to $I_c=1$ milliampere at a collector voltage $V_C$ of approximately 15 volts. This operating point is indicated as P on the drawing. Thus, it is seen that the values of emitter and collector currents obtained by the circuit of Fig. 9 are entirely reasonable and appropriate for use with n-p-n transistors and that the circuit is therefore exceedingly useful in providing a means for obtaining transistor amplifiers with exceptionally high values of input resistance.

The invention is applicable in every detail to a transistor of the p-n-p variety, provided the signs of all currents and voltages be changed.

While the invention has been described in connection with an illustration in which the transistor employed is of the n-p-n (or p-n-p) variety, externally connected as an amplifier in the grounded-collector configuration, it is not limited thereto; and its advantages are obtainable in various degrees with transistors of other types, in circuits of other configurations, and in circuits for other engineering uses, for example, modulators.

Figure 10:
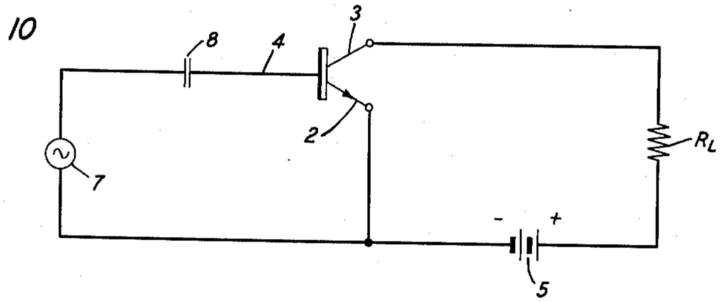
Fig. 10 is a schematic circuit diagram of a grounded-emitter transistor amplifier modified in accordance with the invention.

An illustration of another embodiment of the invention as applied to the grounded-emitter amplifier is shown in Fig. 10. This particular configuration for the circuit is not intended to result in exceedingly high input impedances; and, therefore, it is not in this case so vitally important to eliminate the effects of the emitter biasing resistor. Nevertheless, this circuit effects the elimination of one circuit element—the biasing resistor—and the resulting saving in space and cost may in many applications be of importance.

What is claimed is:

1. A signal translating device comprising a body of semiconductive material having a zone of one conductivity type between and contiguous with a pair of zones of the opposite conductivity type, emitter and collector connections to the outer zones, respectively, a base connection to the intermediate zone, an output circuit connected between said emitter and collector connections, and an input circuit between said base connection and one of said emitter and collector connections and including an unbypassed condenser and an input source, all impedances in said input circuit being connected in series between said source and said body, said input circuit thus presenting an infinite impedance to steady currents, whereby the steady value of the current flow to said base connection is zero.

2. Apparatus as defined in claim 1 wherein the intermediate zone is of P-type conductivity and the outer zones are of N-type conductivity.

3. Apparatus as defined in claim 1 wherein the intermediate zone is of N-type conductivity and the outer zones are of P-type conductivity.

4. Apparatus as defined in claim 1 wherein said input circuit interconnects the base connection with the collector connection.

5. Apparatus as defined in claim 1 wherein said input circuit interconnects the base connection with the emitter connection.

6. A signal translating device comprising a body of semiconductive material having a zone of one conductivity type between and contiguous with a pair of zones of the opposite conductivity type, emitter and collector connections to the outer zones, respectively, a base connection to the intermediate zone, an output circuit connected between said emitter and collector connections, and an input circuit between said base connection and one of said emitter and collector connections and including an input source, an unbypassed blocking condenser connected in series between said source and said body, said blocking condenser being the sole impedance element connected between said source and said body, said input circuit thus presenting an infinite impedance to steady currents, whereby the steady value of the current flow to said base connection is zero.

7. A signal translating device comprising a transistor having a body of semiconductive material, an emitter electrode, a collector electrode, and a base electrode all engaging said body, said transistor being characterized by a current gain factor which is slightly less than unity, an output circuit connected between said emitter electrode and said collector electrode, and an input circuit between said base electrode and one of said emitter and collector electrodes and including an unbypassed condenser and an input source, all impedances in said input circuit being connected in series between said source and body, said input circuit thus presenting an infinite impedance to steady currents, whereby the steady value of the current flow to said base connection is zero.

References Cited in the file of this patent

UNITED STATES PATENTS

| | | |
|---|---|---|
| Re. 23,563 | Barney | Oct. 14, 1952 |
| 2,517,960 | Barney et al. | Aug. 8, 1950 |
| 2,544,211 | Barton | Mar. 6, 1951 |
| 2,569,347 | Shockley | Sept. 25, 1951 |